US010110180B2

(12) United States Patent
Adabi et al.

(10) Patent No.: US 10,110,180 B2
(45) Date of Patent: *Oct. 23, 2018

(54) RADIO FREQUENCY SYSTEM SWITCHING POWER AMPLIFIER SYSTEMS AND METHODS

(71) Applicant: Apple Inc., Cupertino, CA (US)

(72) Inventors: Ehsan Adabi, Mountain View, CA (US); Albert C. Jerng, Woodside, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/401,847

(22) Filed: Jan. 9, 2017

(65) Prior Publication Data

US 2018/0006619 A1 Jan. 4, 2018

Related U.S. Application Data

(63) Continuation of application No. 14/640,978, filed on Mar. 6, 2015, now Pat. No. 9,543,910.

(51) Int. Cl.
*H03F 3/217* (2006.01)
*H03F 1/02* (2006.01)
(Continued)

(52) U.S. Cl.
CPC ............ *H03F 3/217* (2013.01); *H03F 1/0222* (2013.01); *H03F 3/19* (2013.01); *H03F 3/193* (2013.01);
(Continued)

(58) Field of Classification Search
CPC ...... H03F 3/2178; H03F 3/217; H03F 1/0222; H03F 3/19; H03F 3/193; H03F 3/211;
(Continued)

(56) References Cited

U.S. PATENT DOCUMENTS 5,990,739 A 11/1999 Lam
7,479,829 B2 1/2009 Inoue
(Continued)

FOREIGN PATENT DOCUMENTS

GB 2456889 A 8/2009
JP 2012-034227 A1 2/2012
(Continued)

OTHER PUBLICATIONS

WIPS Search Report for Korean Application No. 10-2017-7020785 dated Aug. 11, 2017; 16 pgs.

*Primary Examiner* — Sophia Vlahos
(74) *Attorney, Agent, or Firm* — Fletcher Yoder PC

(57) ABSTRACT

Systems and method for improving operation of a radio frequency system are provided. One embodiment includes a switching power amplifier that outputs an amplified analog electrical signal based on an input electrical signal and voltage of an envelope voltage supply rail. The switching power amplifier includes a first transistor with a gate that receives the input electrical signal, a source electrically coupled to the envelope voltage supply rail, and a drain electrically coupled to an output of the switching power amplifier; a second transistor with a gate that receives the input electrical signal, a source electrically coupled to ground, and a drain electrically coupled to the output; and a third transistor with a gate that receives the input electrical signal, a drain electrically coupled to the envelope voltage supply rail, and a source electrically coupled to an output of another switching power amplifier.

22 Claims, 11 Drawing Sheets

(51) Int. Cl.
  *H03F 3/21* (2006.01)
  *H03F 3/19* (2006.01)
  *H04B 1/04* (2006.01)
  *H03F 3/45* (2006.01)
  *H03F 3/24* (2006.01)
  *H03F 3/193* (2006.01)

(52) U.S. Cl.
  CPC ........... *H03F 3/211* (2013.01); *H03F 3/2173* (2013.01); *H03F 3/2178* (2013.01); *H03F 3/245* (2013.01); *H03F 3/45179* (2013.01); *H04B 1/04* (2013.01); *H03F 2200/451* (2013.01); *H03F 2203/45352* (2013.01); *H03F 2203/45366* (2013.01); *H03F 2203/45394* (2013.01); *H03F 2203/45562* (2013.01); *H03F 2203/45631* (2013.01); *H03F 2203/45638* (2013.01); *H04B 2001/0408* (2013.01)

(58) Field of Classification Search
  CPC .... H03F 3/2173; H03F 3/245; H03F 3/45179; H03F 2200/451; H03F 2203/45352; H03F 2203/45366; H03F 2203/45394; H03F 2203/45562; H03F 2203/45631; H03F 2203/45638; H03F 3/2176; H03F 3/2171; H03F 1/0294; H04B 1/04; H04B 2001/0408
  See application file for complete search history.

(56) References Cited

U.S. PATENT DOCUMENTS

| | | | |
|---|---|---|---|
| 7,705,675 | B2 | 4/2010 | McMorrow |
| 8,149,064 | B2 | 4/2012 | Paul |
| 8,233,860 | B2 | 7/2012 | Lee |
| 8,320,846 | B2 | 11/2012 | Kato |
| 8,686,796 | B2 | 4/2014 | Presti |
| 8,896,375 | B2 | 11/2014 | Park et al. |
| 9,369,088 | B2 | 6/2016 | Takahashi et al. |
| 9,543,910 | B2 * | 1/2017 | Adabi ............... H03F 3/217 |
| 2005/0052237 | A1 | 3/2005 | Paul et al. |
| 2007/0109004 | A1 | 5/2007 | Wu |
| 2010/0109773 | A1 | 5/2010 | Takagi |
| 2012/0027127 | A1 | 2/2012 | Kato |
| 2012/0286868 | A1 | 11/2012 | Haroun et al. |
| 2013/0222061 | A1 | 8/2013 | Park |
| 2014/0044216 | A1 | 2/2014 | Sharma et al. |
| 2014/0333378 | A1 | 11/2014 | Karthaus |
| 2014/0347127 | A1 | 11/2014 | Chen |
| 2015/0035580 | A1 | 2/2015 | Botti |
| 2015/0084697 | A1 | 3/2015 | Takahashi |
| 2015/0303961 | A1 | 10/2015 | Banarjee |
| 2015/0372645 | A1* | 12/2015 | Banerjee ............ H03F 3/193 330/251 |

FOREIGN PATENT DOCUMENTS

| | | |
|---|---|---|
| KR | 10-2013-0097502 A | 9/2013 |
| WO | 2014132577 A1 | 2/2017 |

* cited by examiner

RADIO FREQUENCY SYSTEM SWITCHING POWER AMPLIFIER SYSTEMS AND METHODS

CROSS-REFERENCE TO RELATED APPLICATIONS

Under 35 U.S.C. § 120, this application is a continuation of U.S. patent application Ser. No. 14/640,978 filed on Mar. 6, 2015, which is incorporated by reference herein in its entirety for all purposes.

BACKGROUND

The present disclosure relates generally to radio frequency systems and, more particularly, to switching power amplifiers used in a radio frequency system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices may include a radio frequency system to facilitate wireless communication of data with another electronic device and/or a network. The radio frequency system may include a transceiver that outputs an analog representation of data as an analog electrical signal, which may then be wirelessly transmitted via an antenna. Since the electronic device may be separated by some distance, the radio frequency system may include an amplifier component to control the output power (e.g., strength of analog electrical signals) of the radio frequency system.

In some embodiments, the amplifier component may include a switching (e.g., class-D) power amplifier, which utilizes one or more transistors as electronic switches. In some embodiments, the switching power amplifier may amplify an input analog electrical signal to a desired output power. More specifically, the switching power amplifier may generate the amplified analog electrical signal by connecting an output to an envelope voltage (e.g., $V_{env}$) supply rail or ground based at least in part on an input analog electrical signal.

Ideally, the switching power amplifier should achieve high power efficiency (e.g., output power/DC power consumption), linearly adjust the output power of the amplified analog electrical signals, and maintain a constant phase shift between the input analog electrical signals and the output amplified analog electrical signals. However, in real-world operation, a transistor generally has parasitic capacitance, which may cause the transistor to conduct leakage current from its gate to its drain. In fact, this leakage current may affect power efficiency of the switching power amplifier, linearity of adjustments to the output power, and/or consistency of the phase shift between the input and output amplified analog electrical signals.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to improving operation of a switching (e.g., class-D) power amplifier used in a radio frequency system. Generally, a switching power amplifier receives an input analog electrical signal and outputs an amplified analog electrical signal, which may then be wirelessly transmitted to another electronic device or network. More specifically, the switching power amplifier may generate the amplified analog electrical signal by connecting the output of the switching power amplifier to either an envelope voltage (e.g., $V_{env}$) supply rail or ground based on the input analog electrical signal via one or more transistors.

However, each of the transistors generally has a parasitic capacitance, which enables a leakage current to flow through the transistor from its gate to its drain. As such, particularly when the output power of the amplified analog electrical signal is low, the leakage current may limit the minimum output power, thereby reducing linearity of adjustments to output power, and/or cause an inconsistent phase shift between the input and output analog electrical signals.

Accordingly, the techniques described herein may improve operation of a switching power amplifier by improving linearity of adjustments to output power and/or consistency of a phase shift between an input and an output electrical signal. In some embodiments, when the radio frequency system utilizes a differential scheme with a positive analog electrical signal (e.g., $+V_{in}$) and a negative analog electrical signal (e.g., $-V_{in}$) a first switching power amplifier may be included in a first branch that receives the positive analog electrical signal and a second switching power amplifier may be included in a second branch that receives the negative analog electrical signal.

More specifically, each switching power amplifier may include a first p-type metal-oxide-semiconductor (PMOS) transistor, which has its source electrically coupled to an envelope voltage (e.g., $V_{env}$) supply rail, its gate electrically coupled to the input analog electrical signal, and its drain electrically coupled to an output of the switching power amplifier, and a first n-type metal-oxide-semiconductor (NMOS) transistor, which has its source electrically coupled to ground, its gate electrically coupled to the input analog electrical signal, and its drain electrically coupled to the output. Additionally, each switching power amplifier may include a second NMOS transistor, which has its gate electrically coupled to the input electrical signal, its drain electrically coupled to the envelope voltage supply rail, and its source electrically coupled to an output the switching amplifier of the opposite branch.

Thus, in operation, when the output power is low due to the voltage on the envelope voltage supply rail being lower than a threshold range (e.g., voltages between magnitude of threshold voltage of the PMOS transistors and voltage of the input analog electrical signal when high minus threshold voltage of the NMOS transistors), each switching power amplifier may operate as a dual NMOS inverter (e.g., first NMOS transistor coupled in parallel with second NMOS transistor from opposite branch). As such, leakage current following through the NMOS transistors may cancel out because the NMOS transistors share a common output node and are input inverted (e.g., opposite) analog electrical signals. In this manner, linearity of adjustments to output power and/or consistency of a phase shift between an input and an output analog electrical signal, particularly at low output powers, may be improved.

However, a dual NMOS architecture may result in higher DC power consumption at high output power due to a higher driving voltage of NMOS transistors as compared to a PMOS transistors. Accordingly, since linearity and/or phase shift is less affected by leakage current at high output powers (e.g., envelope voltage greater than the threshold), each switching power amplifier may operate as an NMOS/PMOS inverter (e.g., first NMOS transistor coupled in parallel with first PMOS transistor) when the output power is high due to the voltage on the envelope voltage supply rail being higher than the threshold range. Additionally, when voltage on the envelope voltage supply rail is within the threshold range, each switching power amplifier may operate as a dual NMOS inverter and a NMOS/PMOS inverter in parallel. In this manner, power consumption by the switching power amplifiers may also be reduced, thereby improving efficiency (e.g., output power/DC power consumption) of the radio frequency system.

BRIEF DESCRIPTION OF THE DRAWINGS

Various aspects of this disclosure may be better understood upon reading the following detailed description and upon reference to the drawings in which.

DETAILED DESCRIPTION

Figure 1:
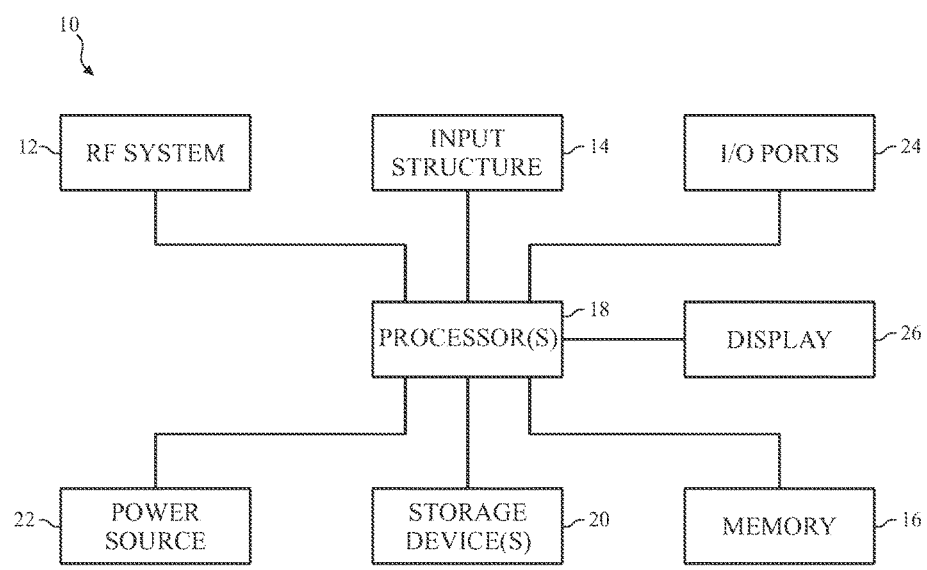
FIG. 1 is a block diagram of a electronic device with a radio frequency system, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, an electronic device may include a radio frequency system to facilitate wirelessly communicating data with another electronic device and/or a network. More specifically, the radio frequency system may modulate radio waves to enable the electronic device to communicate via a personal area network (e.g., Bluetooth network), a local area network (e.g., an 802.11x Wi-Fi network), and/or a wide area network (e.g., a 4G or LTE cellular network). In other words, the radio frequency systems may utilize various wireless communication protocols to facilitate communication of data.

Nevertheless, radio frequency systems may generally be operationally similar regardless of the wireless communication protocol used. For example, to transmit data, processing circuitry may generate a digital representation of the data as a digital electrical signal and a transceiver (e.g., a transmitter and/or a receiver) may then convert the digital electrical signal into one or more analog electrical signals. Based on various factors (e.g., wireless communication protocol, power consumption, distance, etc.), the analog electrical signals may be wirelessly transmitted at different output powers. To facilitate controlling the output power, the radio frequency system may include an amplifier component, which receives the analog electrical signals and outputs amplified analog electrical signals at a desired output power for transmission via an antenna.

In some embodiments, the amplifier component may include one or more switching (e.g., class-D) power amplifiers that utilizes multiple transistors to generate the amplified analog electrical signals. More specifically, a switching power amplifier may generate the amplified analog electrical signals by connecting an output to either an envelope voltage (e.g., $V_{env}$) supply rail or ground based on the input analog electrical signal. For example, when the input analog electrical signal is low (e.g., zero volts) the switching power amplifier may turn on a first transistor and turn off a second transistor to connect the output to the envelope voltage supply rail. On the other hand, when the input signal is high (e.g., a positive voltage) the switching amplifier may turn off the first transistor and turn on the second transistor to connect the output to ground.

In this manner, the output power of the amplified analog electrical signals may be controlled by adjusting the envelope voltage. Thus, to facilitate control over the output power, it may be desirable for the output power of the amplified analog electrical signal to vary proportionally with the magnitude of the envelope voltage. In other words, it may be desirable that the output power and the envelope voltage vary linearly. Additionally, it may be desirable for the phase shift between the amplified analog electrical signals and the input signals to be relatively constant regardless of the output power.

In theory, the transistors would operate as electrical switches by disconnecting electrical power when turned off and connecting electrical power when turned on. However, in real world situations, a transistor generally has a parasitic capacitance, which may enable leakage current to be conducted through the transistor from its gate to its drain. In other words, the operation of a transistor may deviate from that of an ideal switch. In fact, the leakage current may affect linearity (e.g., amplitude output/amplitude input) and phase shift of the switching power amplifier, particularly at low output powers (e.g., envelope voltage lower than a threshold range). For example, when the switching power amplifier only includes a p-type metal-oxide-semiconductor (PMOS) transistor and an n-type metal-oxide-semiconductor (NMOS) transistor coupled in parallel, leakage current in the transistors may place a lower limit on the output power of the switching power amplifier, thereby reducing linearity, and cause phase shift to vary significantly (e.g., 100 degrees) with the output power.

Accordingly, techniques described in the present embodiment may improve operation of radio frequency systems by improving control over output power and consistency of phase shift in switching power amplifiers. For example, some embodiments of a radio frequency system utilize a differential scheme. In such embodiments, a first switching power amplifier may be include in a first branch that receives a positive analog electrical signal (e.g., $+V_{in}$) and a second switching power amplifier may be included in a second branch that receives a negative analog electrical signal (e.g., $-V_{in}$). More specifically, each switching power amplifier may include a first p-type metal-oxide-semiconductor (PMOS) transistor, which has its source electrically coupled to an envelope voltage (e.g., Venv) supply rail, its gate electrically coupled to the input analog electrical signal, and its drain electrically coupled to an output of the switching power amplifier, and a first n-type metal-oxide-semiconductor (NMOS) transistor, which has its source electrically coupled to ground, its gate electrically coupled to the input analog electrical signal, and its drain electrically coupled to the output. Additionally, each switching power amplifier may include a second NMOS transistor, which has its gate electrically coupled to the input analog electrical signal, its drain electrically coupled to the envelope voltage supply rail, and its source electrically coupled to an output of a switching power amplifier in the opposite branch.

Thus, in operation, when the output power is low (e.g., envelope voltage below a threshold range), the switching power amplifiers may connect the first NMOS transistor of a branch in parallel with the second NMOS transistor of the other branch. In other words, the switching power amplifiers may operate as two dual NMOS inverters. More specifically, in each dual NMOS inverter, the first NMOS transistor and the second NMOS transistor receive inverted (e.g., opposite) input analog signals at their respective gates. As such, leakage current following through the first NMOS transistor and the second NMOS transistor may cancel out because the NMOS transistors share a common output node and are supplied inverted input analog electrical signals. In this manner, linearity of adjustments to output power, consistency of a phase shift between an input and an output analog electrical signal, or both, particularly at low output powers, may be improved.

On the other hand, in operation, when the output power is high (e.g., envelope voltage higher than the threshold range), the switching power amplifiers may connect the first NMOS transistor and the first PMOS transistor of a branch in parallel. In other words, the switching power amplifiers may operate as two NMOS/PMOS inverters. More specifically, since the first PMOS may use a lower drive voltage than the NMOS transistors, the power consumption of the switching power amplifier may be reduced. Moreover, since output power is high, effects of leakage current on the amplified analog electrical signals may be small and thus not significantly affect linearity and/or phase shift. In this manner, the techniques described herein may improve operation of the radio frequency system (e.g., improve control over output power and consistency of phase shift in the switching power amplifier), while also reducing power consumption (e.g., improve power efficiency).

To help illustrate, an electronic device 10 that may utilize a radio frequency system 12 is described in FIG. 1. As will be described in more detail below, the electronic device 10 may be any suitable electronic device, such as a handheld computing device, a tablet computing device, a notebook computer, and the like.

Accordingly, as depicted, the electronic device 10 includes the radio frequency system 12, input structures 14, memory 16, one or more processor(s) 18, one or more storage devices 20, a power source 22, input/output ports 24, and an electronic display 26. The various components described in FIG. 1 may include hardware elements (including circuitry), software elements (including computer code stored on a non-transitory computer-readable medium), or a combination of both hardware and software elements. It should be noted that FIG. 1 is merely one example of a particular implementation and is intended to illustrate the types of components that may be present in the electronic device 10. Additionally, it should be noted that the various depicted components may be combined into fewer components or separated into additional components. For example, the memory 16 and a storage device 20 may be included in a single component.

As depicted, the processor 18 is operably coupled with memory 16 and the storage device 20. More specifically, the processor 18 may execute instruction stored in memory 16 and/or the storage device 20 to perform operations in the electronic device 10, such as instructing the radio frequency system 12 to communicate with another device. As such, the processor 18 may include one or more general purpose microprocessors, one or more application specific processors (ASICs), one or more field programmable logic arrays (FPGAs), or any combination thereof. Additionally, memory 16 and/or the storage device 20 may be a tangible, non-transitory, computer-readable medium that stores instructions executable by and data to be processed by the processor 18. For example, the memory 16 may include random access memory (RAM) and the storage device 20 may include read only memory (ROM), rewritable flash memory, hard drives, optical discs, and the like.

Additionally, as depicted, the processor 18 is operably coupled to the power source 22, which provides power to the various components in the electronic device 10. For example, the power source 22 may supply direct current (DC) electrical power to the radio frequency system 12. As such, the power source 22 may include any suitable source of energy, such as a rechargeable lithium polymer (Li-poly) battery and/or an alternating current (AC) power converter. Furthermore, as depicted, the processor 18 is operably coupled with I/O ports 24, which may enable the electronic device 10 to interface with various other electronic devices, and input structures 14, which may enable a user to interact with the electronic device 10. Accordingly, the inputs structures 14 may include buttons, keyboards, mice, trackpads, and the like. Additionally, in some embodiments, the electronic display 26 may include touch sensitive components.

In addition to enabling user inputs, the electronic display 26 may display image frames, such as a graphical user interface (GUI) for an operating system, an application interface, a still image, or video content. As depicted, the display is operably coupled to the processor 18. Accordingly, the image frames displayed by the electronic display 26 may be based on display image data received from the processor 18.

As depicted, the processor 18 is also operably coupled with the radio frequency system 12, which may facilitate communicatively coupling the electronic device 10 to one or more other electronic devices and/or networks. For example, the radio frequency system 12 may enable the electronic device 10 to communicatively couple to a personal area network (PAN), such as a Bluetooth network, a local area network (LAN), such as an 802.11x Wi-Fi network, and/or a wide area network (WAN), such as a 4G or LTE cellular network. As can be appreciated, the radio frequency system 12 may enable communication using various communication protocols and/or varying output powers (e.g., strength of transmitted analog electrical signals).

Operational principles of the radio frequency system 12 may be similar for each of the communication protocols (e.g., Bluetooth, LTE, 802.11x Wi-Fi, etc). More specifically, as will be described in more detail below, the radio frequency system 12 may convert a digital electrical signal containing data desired to be transmitted into an analog electrical signal using a transceiver. The radio frequency system 12 may then amplify the analog electrical signal to a desired output using an amplifier component and output the amplified analog signal using one or more antennae. In other words, the techniques described herein may be applicable to any suitable radio frequency system 12 that operates in any suitable manner regardless of communication protocol used.

Figure 2:
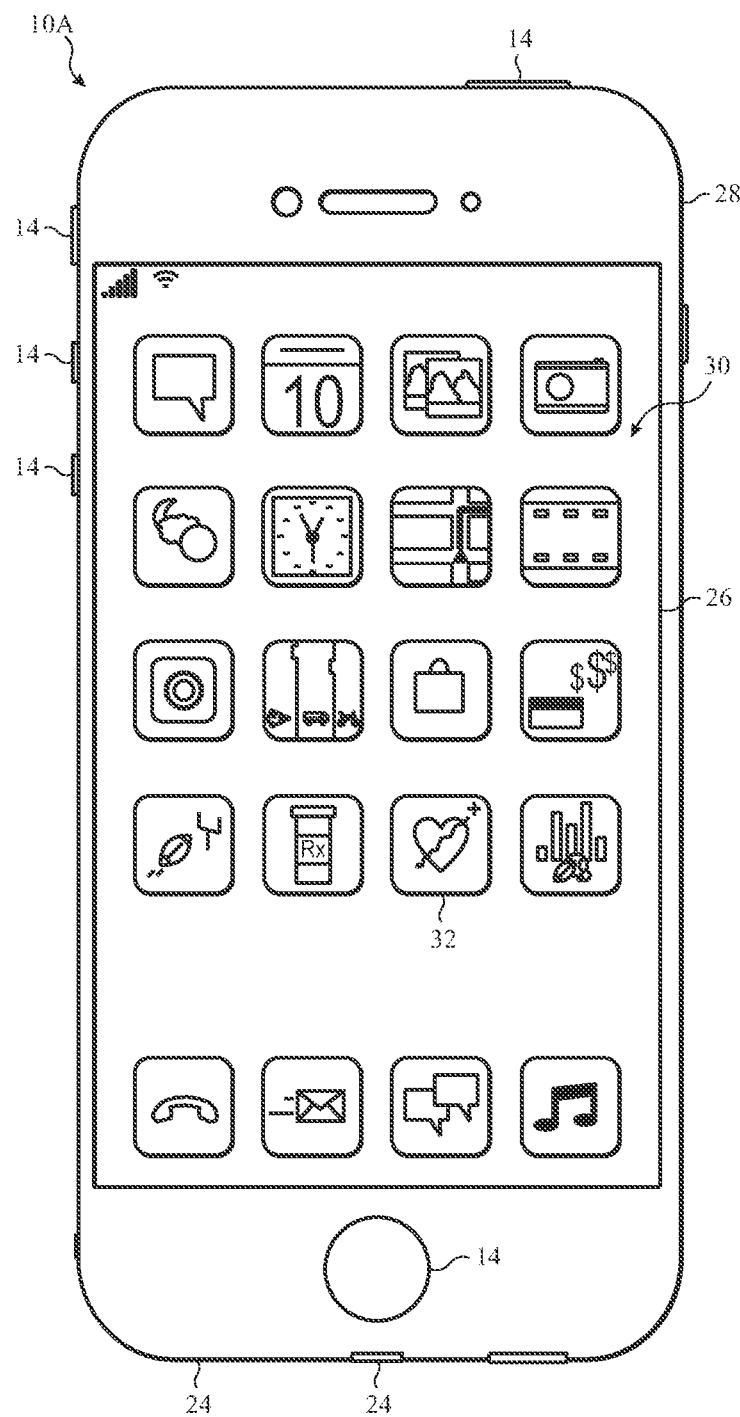
FIG. 2 is an example of the electronic device of FIG. 1, in accordance with an embodiment.

As described above, the electronic device 10 may be any suitable electronic device. To help illustrate, one example of a handheld device 10A is described in FIG. 2, which may be a portable phone, a media player, a personal data organizer, a handheld game platform, or any combination of such devices. For example, the handheld device 10A may be a smart phone, such as any iPhone® model available from Apple Inc. As depicted, the handheld device 10A includes an enclosure 28, which may protect interior components from physical damage and to shield them from electromagnetic interference. The enclosure 28 may surround the electronic display 26, which, in the depicted embodiment, displays a graphical user interface (GUI) 30 having an array of icons 32. By way of example, when an icon 32 is selected either by an input structure 14 or a touch sensing component of the electronic display 26, an application program may launch.

Additionally, as depicted, input structures 14 may open through the enclosure (e.g., housing) 28. As described above, the input structures 14 may enable a user to interact with the handheld device 10A. For example, the input structures 14 may activate or deactivate the handheld device 10A, navigate a user interface to a home screen, navigate a user interface to a user-configurable application screen, activate a voice-recognition feature, provide volume control, and toggle between vibrate and ring modes. Furthermore, as depicted, the I/O ports 24 open through the enclosure 28. In some embodiments, the I/O ports 24 may include, for example, an audio jack to connect to external devices. Additionally, the radio frequency system 12 may also be enclosed within the enclosure 28 and internal to the handheld device 10A.

Figure 3:
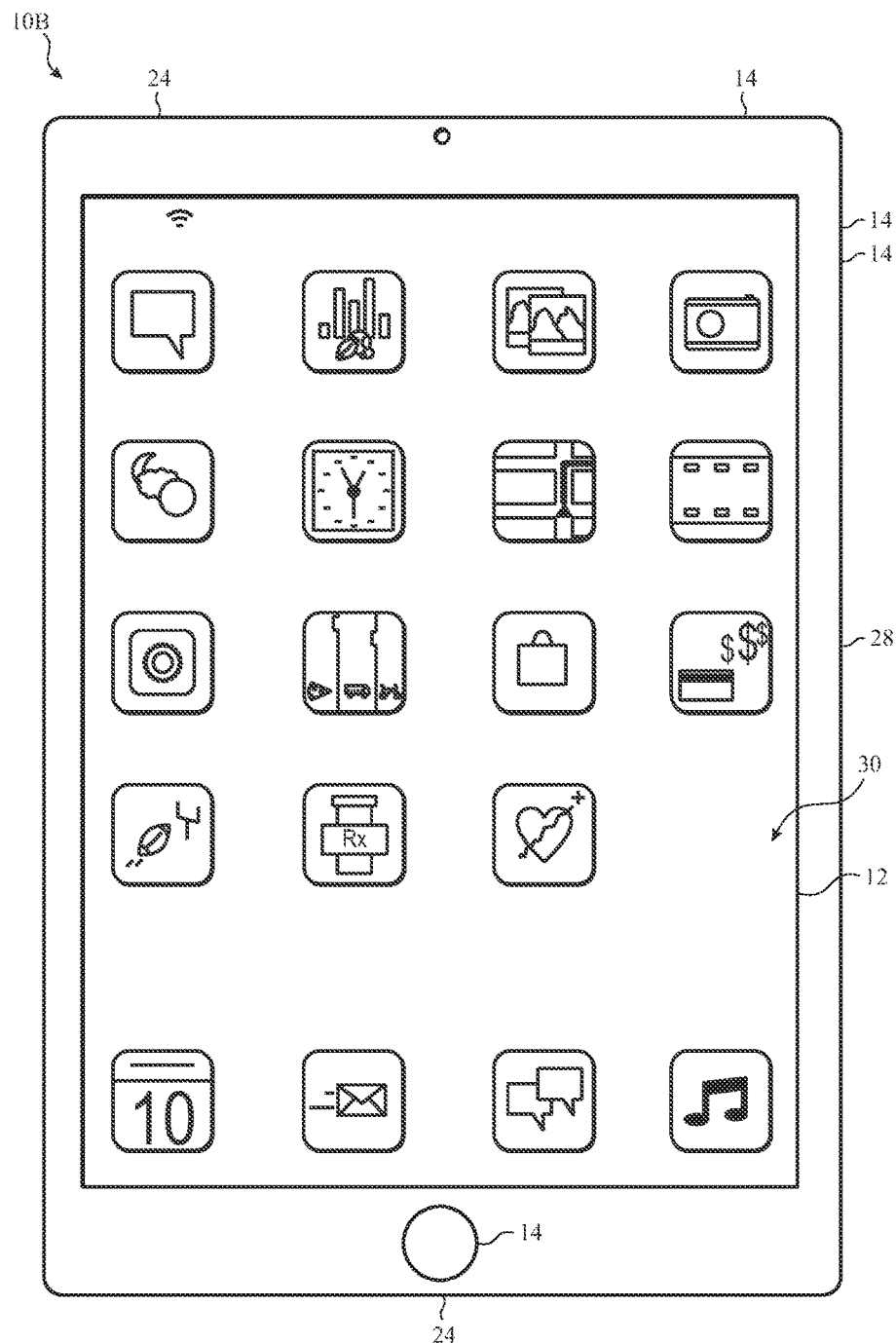
FIG. 3 is an example of the electronic device of FIG. 1, in accordance with an embodiment.
Figure 4:
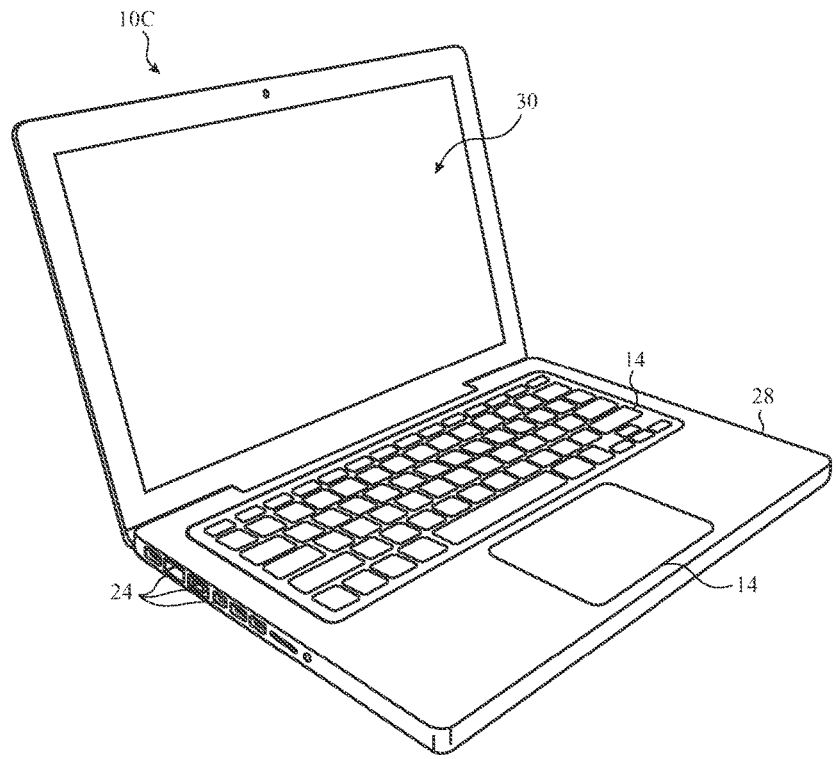
FIG. 4 is an example of the electronic device of FIG. 1, in accordance with an embodiment.

To further illustrate a suitable electronic device 10, a tablet device 10B is described in FIG. 3, such as any iPad® model available from Apple Inc. Additionally, in other embodiments, the electronic device 10 may take the form of a computer 10C as described in FIG. 4, such as any Macbook® or iMac® model available from Apple Inc. As depicted, the tablet device 10B and the computer 10C also include a display 26, input structures 14, I/O ports 24, and an enclosure (e.g., housing) 28. Similar to the handheld device 10A, the radio frequency system 12 may also be enclosed within the enclosure 28 and internal to the tablet device 10B and/or the computer 10C.

Figure 5:
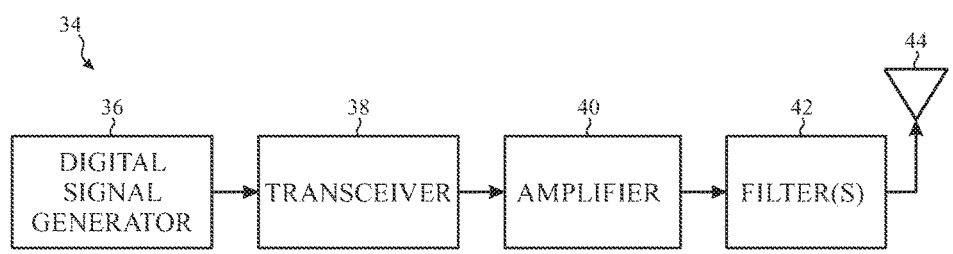
FIG. 5 is block diagram of the radio frequency system of FIG. 1, in accordance with an embodiment.

As described above, the radio frequency system 12 may facilitate communication with other electronic devices and/or a network by wirelessly communicating data. To help illustrate, a portion 34 of radio frequency system 12 is described in FIG. 5. As depicted, the portion 34 includes a digital signal generator 36, a transceiver 38, an amplifier component 40, one or more filters 42, and an antenna 44. The digital signal generator 36 may generate a digital representation of data desired to be transmitted from the electronic device 10 by outputting a digital electrical signal. Accordingly, in some embodiments, the digital signal generator 36 may include the processor 18 and/or a separate processing circuitry, such as a baseband processor or a modem in the radio frequency system 12.

The transceiver 38 may then receive the digital electrical signal and generate an analog representation of the data. In some embodiments, the transceiver 38 may generate an analog representation by outputting an envelope voltage (e.g., $V_{env}$) to indicate a desired output power of the radio frequency system 12 and one or more analog electrical signals (e.g., $+V_{in}$ and $-V_{in}$) to indicate phase (e.g., whether high or low) of the digital electrical signal. For example, when the desired output is 20 dBm, the transceiver 38 may output an envelope voltage of 1.2 volts. Additionally, when the digital electrical signal is high (e.g., "1"), the transceiver 38 may output an analog electrical signal with a positive voltage and, when the digital electrical signal is low (e.g., "0"), the transceiver 38 may output an analog electrical signal at zero volts.

Additionally, in some embodiments, the transceiver 38 may use a differential scheme, thereby generating a positive analog electrical signal (e.g., $+V_{in}$) and a negative analog electrical signal (e.g., $-V_{in}$). More specifically, instead of generating a single analog electrical signal, the transceiver may generate the positive analog electrical signal and the negative analog electrical signal such that they are the inverse of one another and their magnitudes are equal to one half the magnitude of the single analog electrical signal. In other words, when the digital electrical signal is high (e.g., "1"), the positive analog electrical signal may have a positive voltage and the negative analog electrical signal may be zero volts. On the other hand, when the digital electrical signal is low (e.g., "0"), the positive analog electrical signal may have zero volts and the negative analog electrical signal may be a positive voltage.

Since the output power of the analog electrical signal may be small, the amplifier component 40 may receive and amplify the analog electrical signal by outputting an amplified analog electrical signal. For example, when the positive and negative analog electrical signals are received, the amplifier component 40 may output a positive amplified analog electrical signal (e.g., $+V_{out}$) and a negative amplified analog electrical signal (e.g., $-V_{out}$). As can be appreciated, the positive amplified analog electrical signal and the negative amplified analog signal may also be the inverse of one another.

Moreover, the amplifier component 40 may vary amplitude of the amplified analog electrical signal to enable the output power of the radio frequency system 12 to be adjusted. As will be described in more detail below, the amplifier component 40 may include one or more switching power amplifiers, which includes one or more transistors. In such an embodiment, the switching power amplifiers may generate the amplified analog electrical signal by turning on and off the transistors to connect the output of the switching power amplifier to either an envelope voltage (e.g., $V_{env}$) supply rail or ground based on the input analog electrical signal received from the transceiver 38. For example, when the positive analog electrical signal is high and the negative analog electrical signal is low, the positive amplified analog electrical signal may be the envelope voltage and the negative amplified analog electrical signal may be zero volts. On the other hand, when the positive analog electrical signal is low and the negative analog electrical signal is high, the positive amplified analog electrical signal may be zero volts and the negative amplified analog electrical signal may be the envelope voltage.

As can be appreciated, noise may be introduced by the transceiver 38 and/or the amplifier component 40, such as spurious or out of band noise. As such, one or more filters 42 may remove introduced noise from the amplified analog electrical signal and output a filtered analog electrical signal. The filtered analog electrical signal may then be wirelessly transmitted to another electronic devices and/or a network via the antenna 44 as modulated radio waves.

Figure 6:
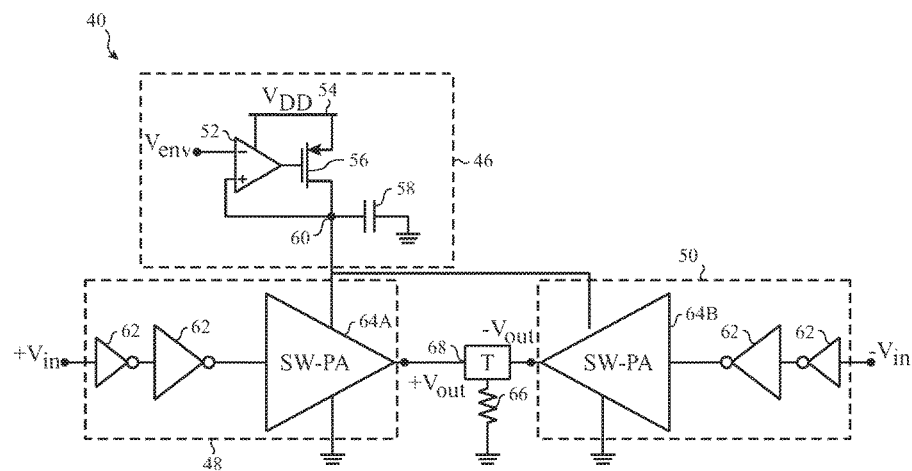
FIG. 6 is a schematic diagram of an amplifier component used in the radio frequency system of FIG. 5, in accordance with an embodiment.

As described above, the amplifier component 40 may include one or more switching power amplifiers to facilitate controlling magnitude of the amplified analog electrical signal and, thus, output power of the radio frequency system 12. To help illustrate, a more detailed view of the amplifier component 40 is described in FIG. 6. In the depicted embodiment, the amplifier component 40 utilizes a differential scheme and includes an envelope voltage amplifier 46, a first branch 48 that receives the positive analog electrical signal $+V_{in}$, and a second branch 50 that receives the negative analog electrical signal $-V_{in}$.

As depicted, the envelope voltage amplifier 46 includes an operational amplifier 52 that receives the envelope voltage $V_{env}$ from the transceiver 38, a power supply rail 54, a transistor 56, and a capacitor 58. In the depicted embodiment, the envelope voltage amplifier 46 is connected in a negative feedback loop. More specifically, the operational amplifier 52 may receive the envelope voltage at its inverting terminal and the output voltage of the envelope amplifier 46 (e.g., voltage at output 60) at the non-inverting terminal. Accordingly, the operational amplifier 52 may amplify the difference between the output voltage, which is filtered by the capacitor 58, and the envelope voltage.

Additionally, in the depicted embodiment, the transistor 56 has a gate connected to the output of the operational amplifier 52, a source connected to the power supply rail 54, and a drain connected to the output 60 of the envelope voltage amplifier 46. More specifically, a power source, such as power source 22, may supply DC electrical power to the power supply rail 54 such that the supply rail 54 has a voltage of $V_{DD}$. As such, the transistor 56 may selectively connect the output 60 to the power supply rail 54 based on difference between the output voltage and the envelope voltage. In this manner, the envelope voltage amplifier 46 may output electrical power at approximately the envelope voltage to the first branch 48 and the second branch 50.

As depicted, each branch 48 or 50 includes one or more preliminary (e.g., driving) power amplifiers (e.g., inverters) 62 and a switching power amplifier 64. More specifically, in operation, the one or more preliminary power amplifiers 62 may each amplify (e.g., increase magnitude) of received analog electrical signals to a voltage sufficient to drive the switching power amplifier 64. The switching power amplifiers 64 may then each amplify the received analog electrical signals to a desired output power based at least in part on the electrical power output from the envelope voltage amplifier 46. For example, in the depicted embodiment, the first branch 48 may output a positive amplified analog electrical signal $+V_{out}$ and the second branch 50 may output a negative amplified analog electrical signal $-V_{out}$.

The amplified analog electrical signal may then be received by a load 66, such as filter 42 and/or antenna 44, for transmittance. Thus, when the radio frequency system 12 utilizes a differential scheme, the positive amplified analog electrical signal and the negative amplified analog electrical signal may be combined into a single amplified analog electrical signal via a transformer 68.

As described above, the switching power amplifiers 64A and 64B may output the amplified analog electrical signals at a desired output power based at least in part on the envelope voltage. To help illustrate, a more detailed view of a first switching power amplifier 64A in the first branch 48 and a second switching power amplifier 64B in the second branch 50 are described in FIG. 7. As depicted, the first switching power amplifier 64A receives a positive analog electrical signal (e.g., $+V_{in}$), the second switching power amplifier 64B receives a negative analog electrical signal (e.g., $-V_{in}$), and both switching power amplifiers 64A and 64B are coupled in parallel between an envelope voltage supply rail 70 and ground 72. More specifically, the envelope voltage amplifier 46 supplies electrical power to the envelope voltage supply rail at the envelope voltage ($V_{env}$).

Additionally, as depicted, the switching power amplifiers 64A and 64B each include a first PMOS transistor 74, a first NMOS transistor 76, a second PMOS transistor 78, a second NMOS transistor 80, and metering (e.g., smoothing) components, which include a capacitor 82 and an inductor 84 in series. More specifically, the first PMOS transistor 74 and the first NMOS transistor 76 are coupled in parallel such that the source of the first PMOS transistor 74 is electrically coupled to the envelope voltage supply rail 70, the source of the first NMOS transistor 76 is electrically coupled to ground 72, the drains are electrically coupled to the metering components, and the gates are electrically coupled to the input analog electrical signal. Additionally, the second NMOS transistor 80 and the second PMOS transistor 78 are coupled in parallel such that the drain of the second NMOS transistor 80 is electrically coupled to the envelope voltage supply rail 70, the drain of the second PMOS transistor 78 is electrically coupled to ground 72, the sources are electrically coupled to the metering components of the opposite branch, and the gates are electrically coupled to the input analog electrical signal. Furthermore, in some embodiments, the NMOS transistors 76 and 80 may have generally the same operational characteristics (e.g., parasitic capacitance and/or leakage current) and the PMOS transistors 74 and 78 may have generally the same operational characteristics (e.g., parasitic capacitance and/or leakage current) to facilitate reducing effects of leakage current.

In operation, the switching power amplifiers 64A and 64B may operate as NMOS/PMOS inverters when the envelope voltage is above a threshold range, as dual NMOS inverter when the envelope voltage is below the threshold range, and as a combination inverter (e.g., dual NMOS inverter coupled in parallel with a NMOS/PMOS inverter) when the envelope voltage is within the threshold rage. In some embodiments, the threshold range may include voltages between the threshold voltage of the PMOS transistors (e.g., 74 and 78) and voltage of the input analog electrical signal when high (e.g., driving voltage of the preliminary amplifiers 62) minus the threshold voltage of the NMOS transistors (e.g., 76 and 80). To help illustrate, FIG. 8A describes operation of the switching power amplifiers 64A and 64B when the envelope voltage (e.g., $V_{envHigh}$) is above the threshold range and FIG. 8B describes operation of the switching power amplifiers 64A and 64B when the envelope voltage (e.g., $V_{envLow}$) is below the threshold range.

Figure 8A:
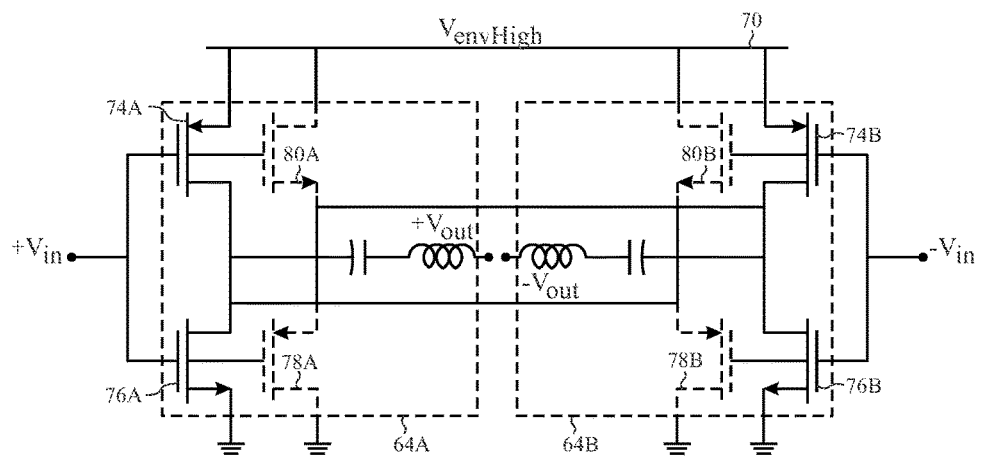
FIG. 8A is a schematic diagram of the switching power amplifiers of FIG. 7 when envelope voltage is high, in accordance with an embodiment.

As depicted in FIG. 8A, when the envelope voltage is higher than the threshold range, the second NMOS transistors 80 and the second PMOS transistors 78 may be maintained in an off state. More specifically, the NMOS transistors 76 and 80 may have a threshold voltage (e.g., gate to source voltage) that is greater than difference between voltage of the input analog electrical signal (e.g., $+V_{in}$ or $-V_{in}$) and the envelope voltage (e.g., $V_{envHigh}$). In other words, when the input analog electrical signal is low, the second NMOS transistor 80 may be off because the gate voltage is approximately zero volts. Additionally, even when the input analog electrical signal is high, the second NMOS transistor 80 may remain off because the difference between the gate voltage (e.g., voltage of the input analog electrical signal) and the source voltage (e.g., envelope voltage) is less than the threshold voltage of the second NMOS transistor 80.

Furthermore, the PMOS transistor 74 and 78 may have a threshold voltage (e.g., source to gate voltage) greater than the difference between the envelope voltage (e.g., $V_{envHigh}$) and the voltage of the received analog electrical signal. In other words, when the received analog electrical signal is high, the second PMOS transistor 78 may be off because the gate voltage is the positive voltage of the received analog electrical signal. Additionally, even when the received analog electrical signal is low, the second PMOS transistor 78 may remain off because the gate voltage and the source voltage are both approximately zero volts.

As such, when the envelope voltage is above the threshold range, the switching power amplifiers 64A and 64B may operate as NMOS/PMOS inverters with the first PMOS transistor 74 and the first NMOS transistor 76 coupled in parallel. More specifically, in each switching power amplifier 64A and 64B, when the input analog electrical signal (e.g., $+V_{in}$ or $-V_{in}$) is high, the first PMOS transistor 74 may be turned off and the first NMOS transistor 76 may be turned on, thereby connecting the output to ground. On the other hand, when the received analog electrical signal is low, the first NMOS transistor 76 may be turned off and the first PMOS transistor 74 may be turn on, thereby connecting the output to the envelope voltage supply rail 70.

In this manner, the first switching power amplifier 64A outputs a positive amplified analog electrical signal $+V_{out}$ and the second switching power amplifier 64B outputs a negative amplified analog electrical signal $-V_{out}$ at a desired output power (e.g., based at least in part on the envelope voltage). Additionally, since the switching power amplifiers 64A and 64B generate the amplified analog electrical signals (e.g., $+V_{out}$ and $-V_{out}$) based on inverted signals, the amplified analog electrical signals may also be the inverse of one another.

Figure 8B:
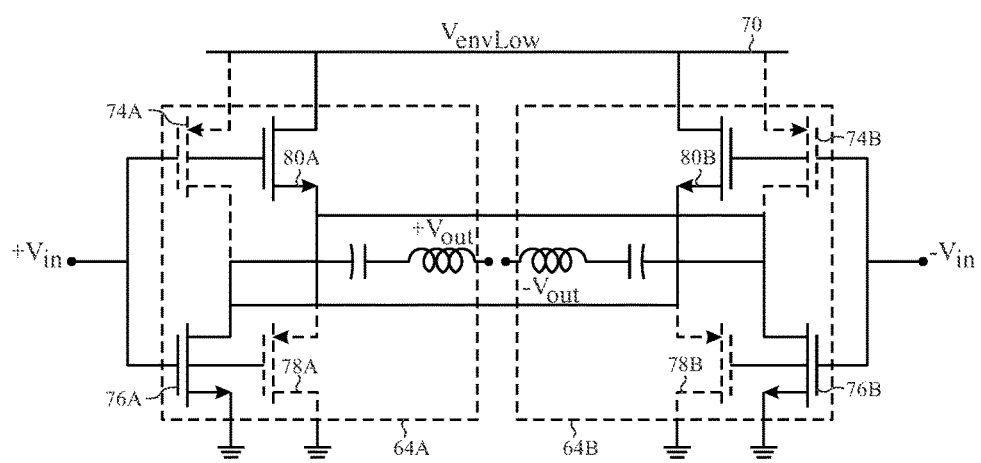
FIG. 8B is a schematic diagram of the switching power amplifiers of FIG. 7 when envelope voltage is low, in accordance with an embodiment.

On the other hand, as depicted in FIG. 8B, when the envelope voltage is lower than the threshold range, the first PMOS transistor 74 and the second PMOS transistor 78 may be maintained in an off state. As described above, the threshold range may be voltages between magnitude of the threshold voltage of the first PMOS transistor 74 and voltage of the input analog electrical signal when high minus the threshold voltage of the NMOS transistors 76 and 80. Thus, when the input analog electrical signal is high, the first PMOS transistor 74 and the second PMOS transistor 78 may be off because the gate voltage is the positive voltage of the input analog electrical signal. Additionally, even when the input analog electrical signal is low, the first PMOS transistor 74 and the second PMOS transistor 78 may remain off because difference the source voltage (e.g., envelope voltage) and the gate voltage (e.g., zero volts) is less than the threshold voltage of the PMOS transistors 74 and 78.

As such, when the envelope voltage is below the threshold range, the switching power amplifiers 64A and 64B may operate as dual NMOS inverters with the first NMOS transistor 76 coupled in parallel with the second NMOS transistor of the opposite branch. More specifically, when the input analog electrical signal (e.g., $+V_{in}$ or $-V_{in}$) is high, the first NMOS transistor 76 may be turned on and the second NMOS transistor 80 of the opposite branch may off, thereby connecting the output to ground. On the other hand, when the received analog electrical signal is low, the first NMOS transistor 76 may be turned off and the second NMOS transistor 80 of the opposite branch may be turned on, thereby connecting the output to the envelope voltage supply rail 70.

Moreover, since the switching power amplifiers 64A and 64B operate as dual NMOS inverters, the effects of leakage current may be reduced. More specifically, as described above, each transistor generally has a parasitic capacitance, which enables a leakage current to flow. For example, in the depicted embodiment, a first leakage current may flow through the first PMOS transistor 74A and the first NMOS transistor 76A in the first switching power amplifier 64A and a second leakage current may flow through the second PMOS transistor 78B and the second NMOS transistor 80B of the second switching power amplifier 64B, which may both be supplied to the positive amplified analog electrical signal $+V_{out}$.

Generally, the amount of leakage current conducted by a transistor may be based at least in part on the parasitic capacitance of the transistor. Accordingly, since parasitic capacitance across the first PMOS transistor 74A and the first NMOS transistor 76A is generally the same as parasitic capacitance across the second NMOS transistor 80B and the second PMOS transistor 78B, magnitude of the first leakage current and the second leakage current is approximately the same. Additionally, since the input analog electrical signals (e.g., $+V_{in}$ and $-V_{in}$) are the inverse to one another, the phase of first leakage current and the second leakage current may also be the inverse (e.g., opposite) of one another, thereby canceling out.

Similarly, in the depicted embodiment, a third leakage current may flow through the first PMOS transistor 74B and the first NMOS transistor 76B of the second switching power amplifier 64B and a fourth leakage current may flow through the second PMOS transistor 78A and the second NMOS transistor 80A of the first switching power amplifier, which may both be supplied to the negative amplified analog electrical signal $-V_{out}$. However, since the input analog electrical signals (e.g., $-V_{in}$ and $+V_{in}$) are the inverse of one another and parasitic capacitance is approximately equal, the third leakage current and the fourth leakage may also cancel out.

In this manner, the switching power amplifiers 64A and 64B may be operated to reduce the effect of leakage current, particularly when output power is low (e.g., below a output power threshold range), to improve linearity of control over the output power and consistency of phase shift between the input and output analog electrical. Additionally, the switching power amplifiers 64A and 64B may be operated to reduce DC power consumption supplied from the power source 22, particularly when the output power is high (e.g., higher than the output power threshold range), to improve efficiency (e.g., output power/DC power consumption) of the radio frequency system 12.

Figure 9:
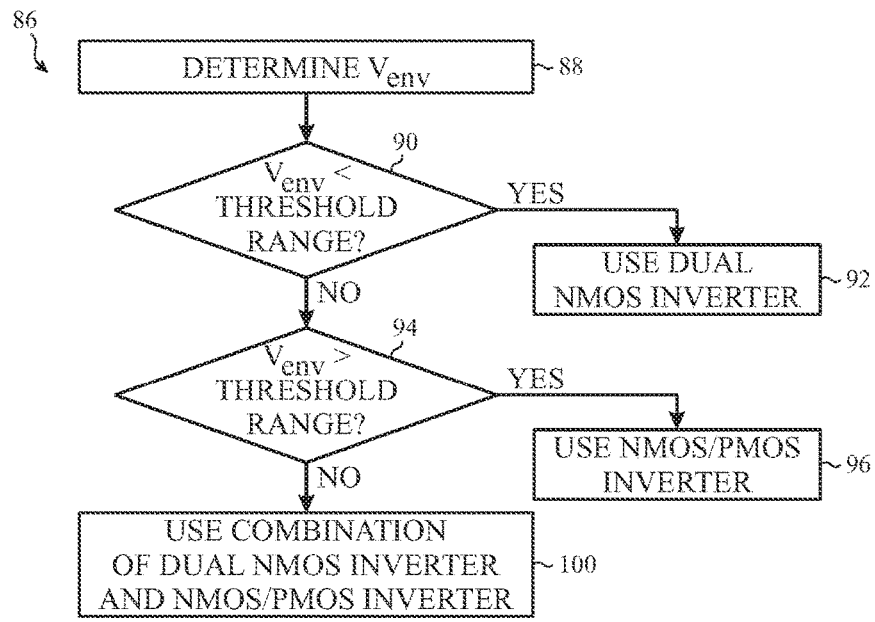
FIG. 9 is a flow diagram describing a process for operating switching power amplifiers, in accordance with an embodiment.

To further illustrate, one embodiment of a process 86 for operating switching power amplifiers 64 is described in FIG. 9. Generally, the process includes determining the envelope voltage (process block 88), determining whether the envelope voltage is less than a threshold range (decision block 90), using a dual NMOS inverter when the envelope voltage is less than the threshold range (process block 92), determining whether the envelope voltage is greater than the threshold range when the envelope voltage is not less than the threshold range (decision block 94), using a NMOS/PMOS inverter when the envelope voltage is greater than the threshold range (process block 96), and using a combination of the dual NMOS inverter and the NMOS/PMOS inverter when the threshold voltage is not greater than the threshold range (process block 100). In some embodiments, the process 86 may be implemented using instructions stored in the memory 16 and/or another suitable tangible non-transitory computer-readable medium and executable by the processor 18 and/or another suitable processing circuitry.

Accordingly, the radio frequency system 12 may determine the envelope voltage (process block 88). In some embodiments, the radio frequency system 12 may poll the transceiver 38 for the envelope voltage output used to generate the desired output power. Additionally or alternatively, the radio frequency system 12 may include one or more sensors (e.g., voltage sensors) to measure voltage output by the transceiver and/or voltage on the envelope voltage supply rail 70.

The radio frequency system 12 may then determine whether the envelope voltage is less than a threshold range (decision block 90). In some embodiments, the threshold range may include voltages between the threshold voltage of the PMOS transistors (e.g., 74 and 78) and voltage of the input analog electrical signal when high minus the threshold voltage of the NMOS transistors (e.g., 76 and 80). Additionally, in some embodiments, the threshold range may be predetermined and stored in memory 16 and/or storage device 20. Accordingly, in such embodiments, the radio frequency system 12 may retrieve the threshold range and compare it with the envelope voltage.

When the envelope voltage is less than the threshold range, the radio frequency system 12 may operate the switching power amplifiers 64 as dual NMOS inverters (process block 92). More specifically, the radio frequency system 12 may keep the first PMOS transistor 74 and the second PMOS transistor 78 in an off state. Additionally, the radio frequency system 12 may connect the first NMOS transistor 76 of one branch with the second NMOS transistor 80 of the other branch in parallel. As described above, the dual NMOS inverters may enable leakage current to be canceled out, thereby improving linearity and/or consistency of phase shift particularly at low output powers (e.g., low envelope voltage).

On the other hand, when not less than the threshold range, the radio frequency system 12 may determine whether the envelope voltage is greater than the threshold range (decision block 94). When the envelope voltage is greater than the threshold range, the radio frequency system 12 may operate the switching power amplifiers 64 as NMOS/PMOS inverters (process block 96). More specifically, the radio frequency system 12 may keep the second PMOS transistor 78 and the second NMOS transistor 80 in an off state. Additionally, the radio frequency system 12 may connect the first PMOS transistor 74 and the first NMOS transistor 76 of each branch in parallel. As described above, the use of NMOS/PMOS inverters may enable power consumption to be reduced, thereby improving power efficiency particularly at high output powers (e.g., high envelope voltage).

Additionally, when not greater and not less than the threshold range, the radio frequency system may operate the switching power amplifiers 64 as a dual NMOS inverter coupled in parallel with a NMOS/PMOS inverter (process block 100). As described above, the threshold may be a range of voltages between magnitude of the threshold voltage of the first PMOS transistor 74 and voltage of the input analog electrical signal when high minus the threshold voltage of the NMOS transistors 76 and 80. As such, when the envelope voltage is within the threshold range, the transistors may be in a region when the transistors are partially turned on.

As such, the radio frequency system 12 may operate the switching power amplifiers 64 using a combination of the first PMOS transistors 74, the first NMOS transistors 76, and the second NMOS transistors 80. In other words, each switching power amplifier 64 may output the amplified analog electrical signal based at least in part on current conducted by the first PMOS transistor 74 of that branch and current conducted by the second NMOS transistor 80 of the opposite branch. In fact, as will be described in more detail below, the first PMOS transistor 74 and the second NMOS transistor 80 may be selected such that the sum of the output current varies linearly with the envelope voltage even while in the threshold range.

Figure 10:
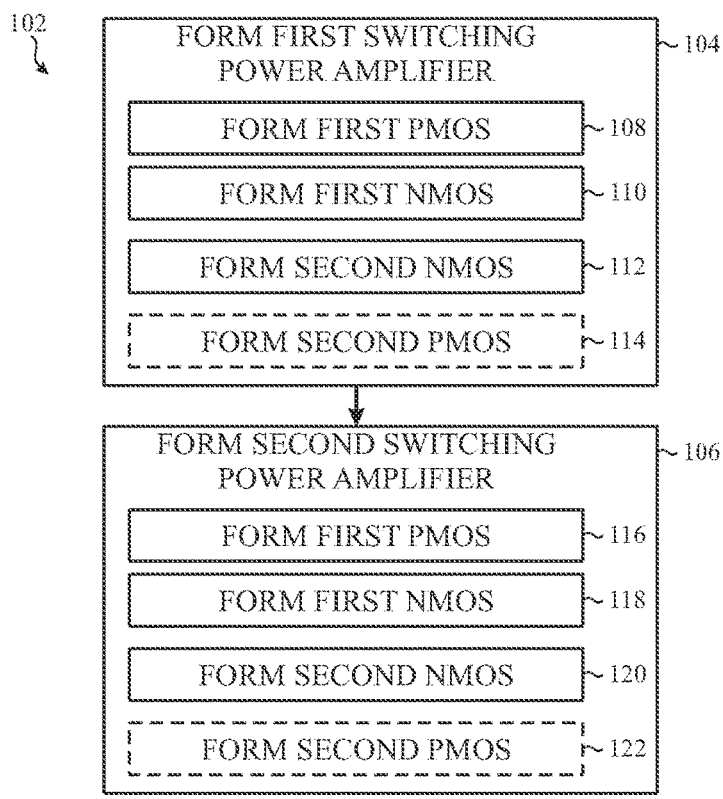
FIG. 10 is a flow diagram describing a process for assembling switching power amplifiers, in accordance with an embodiment.

Thus, the techniques described herein describe switching power amplifiers 64 that may be used to improve operation of a radio frequency system 12. One embodiment of a process 102 for manufacturing a pair of switching power amplifiers (e.g., 64A and 64B) is described in FIG. 10. Generally, the process 102 includes forming a first switching power amplifier (process block 104) and forming a second switching power amplifier (process block 106). In some embodiments, the process 102 may be implemented by a manufacturer using instructions stored on any suitable tangible non-transitory computer-readable medium and executable by any suitable processing circuitry.

Accordingly, the manufacturer may form the first switching power amplifier (process block 104), which includes forming a first PMOS transistor (process block 108), forming a first NMOS transistor (process block 110), forming a second NMOS transistor (process block 112), and optionally forming a second PMOS transistor (process block 114). In some embodiments, the manufacturer may form the first PMOS transistor (e.g., first PMOS transistor 74A) and the first NMOS transistor (e.g., first NMOS transistor 76A) in the first switching power amplifier (e.g., switching power amplifier 64A) such that they are coupled in parallel. More specifically, the first PMOS transistor 74 may be formed so that its source may be electrically coupled to an envelope voltage (e.g., $V_{env}$) supply rail 70, its gate may be electrically coupled to an analog electrical signal input to the first switching power amplifier (e.g., $+V_{in}$), and its drain may be electrically coupled to an output of the first switching power amplifier (e.g., $+V_{out}$), and the first NMOS transistor 76 may be formed so that its source may be electrically coupled to ground 72, its gate may be electrically coupled to the analog electrical signal input to the first switching power amplifier, and its drain may be electrically coupled to the output of the first switching power amplifier.

Additionally, the second NMOS transistor (e.g., second NMOS transistor 80A) may be formed in the first switching power amplifier such that its gate may be electrically coupled to the analog electrical signal input to the first switching power amplifier, its drain may be electrically coupled to the envelope voltage supply rail 70, and its source may be electrically coupled to an output of the second switching power amplifier. Furthermore, the second PMOS transistor (e.g., second PMOS transistor 78A) may be formed such that it is coupled in parallel with the second NMOS transistor 80. More specifically, the second PMOS transistor 78 may be formed in the first switching power amplifier such that its gate may be electrically coupled to the analog electrical signal input to the first switching power amplifier, its drain may be electrically coupled to ground 72, and its source may be electrically coupled to the output of the second switching power amplifier.

Figure 7:
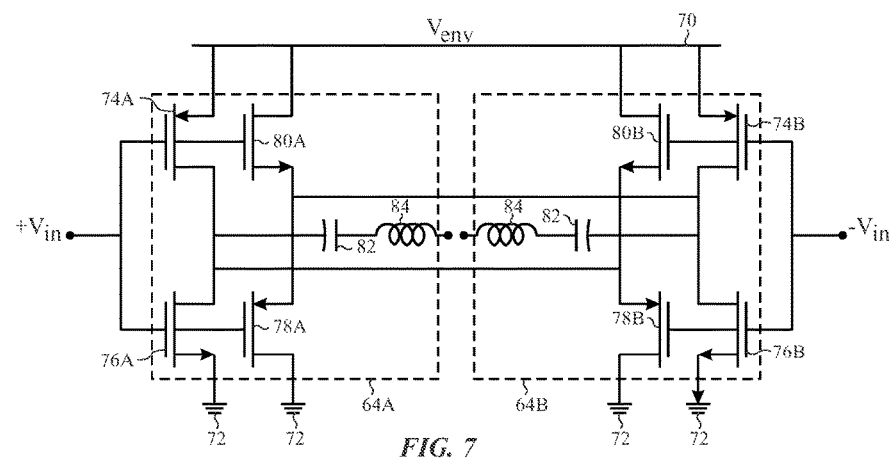
FIG. 7 is schematic diagram of one embodiment of switching power amplifiers used in the amplifier component of FIG. 6, in accordance with an embodiment.

It should be noted that with regard to the embodiment of the switching power amplifiers 64A and 64B described in FIG. 7, the second PMOS transistor 78 is generally maintained in an off state. In fact, as will be described in more detail below, even when the second PMOS transistor 78 is omitted, the effects of the leakage current may still be reduced. As such, the second PMOS transistor 78 may be optionally formed in the first switching power amplifier.

Similar to the first switching power amplifier, the manufacturer may form the second switching power amplifier (process block 106), which includes forming a first PMOS transistor (process block 116), forming a first NMOS transistor (process block 118), forming a second NMOS transistor (process block 120), and optionally forming a second PMOS transistor (process block 122). In some embodiments, the manufacturer may form the first PMOS transistor (e.g., first PMOS transistor 74B) and the first NMOS transistor (e.g., first NMOS transistor 76B) in the second switching power amplifier (e.g., switching power amplifier 64B) such that they are coupled in parallel. More specifically, the first PMOS transistor 74 may be formed so that its source may be electrically coupled to an envelope voltage (e.g., $V_{env}$) supply rail 70, its gate may be electrically coupled to the analog electrical signal input to the second switching power amplifier (e.g., $-V_{in}$), and its drain may be electrically coupled to an output of the second switching power amplifier (e.g., $-V_{out}$), and the first NMOS transistor 76 may be formed so that its source may be electrically coupled to ground 72, its gate may be electrically coupled to the analog electrical signal input to the second switching power amplifier, and its drain may be electrically coupled to the output of the second switching power amplifier.

Additionally, the second NMOS transistor (e.g., second NMOS transistor 80B) may be formed so that its gate may be electrically coupled to the analog electrical signal input to the second switching power amplifier, its drain may be electrically coupled to the envelope voltage supply rail 70, and its source may be electrically coupled to the output of the first switching power amplifier. Furthermore, the second PMOS transistor (e.g., second PMOS transistor 78B) may be formed such that it is coupled in parallel with the second NMOS transistor 80. More specifically, the second PMOS transistor 78 may be formed so that its gate may be electrically coupled to the analog electrical signal input to the second switching power amplifier, its drain may be electrically coupled to ground 72, and its source may be electrically coupled to the output of the first switching power amplifier.

Figure 11:
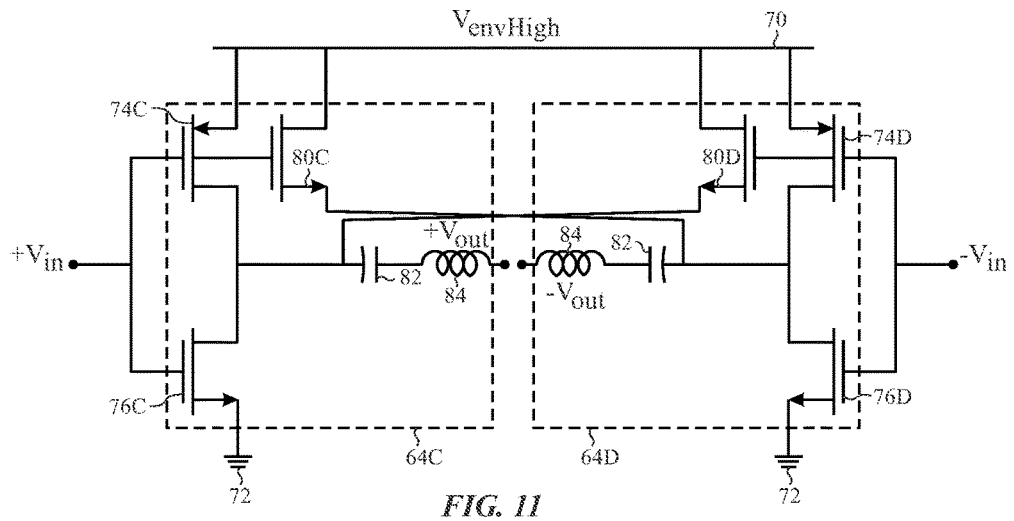
FIG. 11 is a schematic diagram of another embodiment of switching power amplifiers used in the amplifier component of FIG. 6, in accordance with an embodiment.

Furthermore, as in the first switching power amplifier, the second PMOS transistor 78 may be optionally formed in the second switching power amplifier while still reducing the effects of leakage current. To help illustrate, one embodiment of switching power amplifiers 64 without the second PMOS transistors 78 is described in FIG. 11. Similar to the embodiment described in FIG. 7, a first switching power amplifier 64C receives a positive analog electrical signal $+V_{in}$, a second switching power amplifier 64D receives a negative analog electrical signal $-V_{in}$, and both switching power amplifiers 64C and 64D are coupled in parallel between an envelope voltage supply rail 70 and ground 72.

Additionally, as depicted, the first switching power amplifier 64C and the second switching power amplifier 64D each includes the first PMOS transistor 74, the first NMOS transistor 76, the second NMOS transistor 80, and metering components (e.g., the capacitor 82 and the inductor 84 in series). More specifically, the first PMOS transistor 74 and the first NMOS transistor 76 are coupled in parallel such that the source of the first PMOS transistor 74 is electrically coupled to the envelope voltage supply rail 70, the source of the first NMOS transistor 76 is electrically coupled to ground 72, the drains are electrically coupled to the metering components, and the gates are electrically coupled to the input analog electrical signal. Additionally, the second NMOS transistor 80 is coupled such that the drain is electrically coupled to the envelope voltage supply rail 70, the source is electrically coupled to the metering components of the opposite branch, and the gate is electrically coupled to the input analog electrical signal. Furthermore, the NMOS transistors 76 and 80 may have generally the same operational characteristics (e.g., parasitic capacitance and/or leakage current).

Similar to the embodiment described in FIG. 7, in operation, the switching power amplifiers 64C and 64D may operate as NMOS/PMOS inverters when the envelope voltage is above the threshold range, as dual NMOS inverters when the envelope voltage is below the threshold range, and as combination inverters (e.g., a NMOS/PMOS inverter coupled in parallel with a dual NMOS inverter) when the envelope voltage is within the threshold range. To help illustrate, FIG. 12A describes operation of the switching power amplifiers 64C and 64D when the envelope voltage (e.g., $V_{envHigh}$) is above the threshold range and FIG. 8B describes operation of the switching power amplifiers 64C and 64D when the envelope voltage (e.g., $V_{envLow}$) is below the threshold range.

Figure 12A:
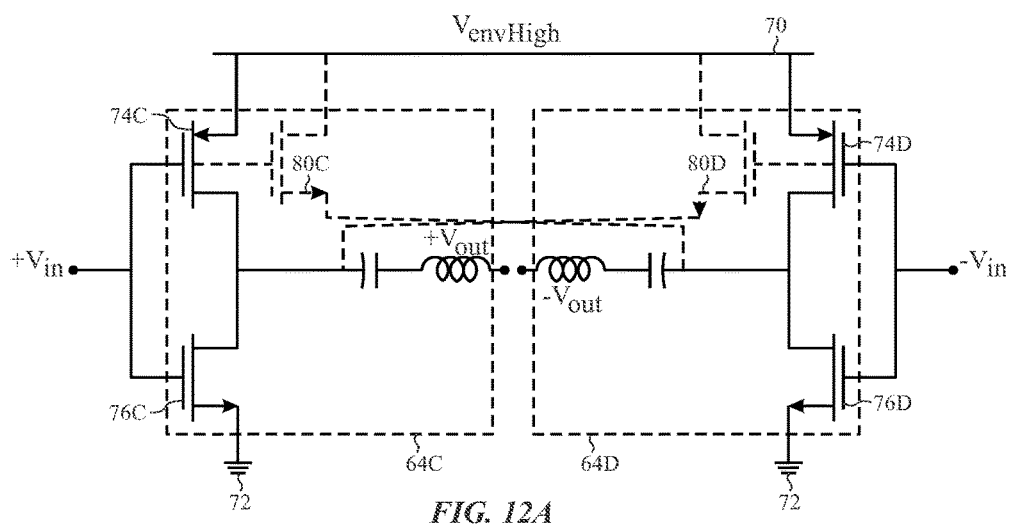
FIG. 12A is a schematic diagram of the switching power amplifiers of FIG. 11 when the envelope voltage is high, in accordance with an embodiment.

As depicted in FIG. 12A, when the envelope voltage is higher than the threshold range, the second NMOS transistors 80 may be maintained in an off state because their threshold voltage (e.g., gate to source voltage) is greater than difference between voltage of the input analog electrical signal (e.g., $+V_{in}$ or $-V_{in}$) and the envelope voltage (e.g., $V_{envHigh}$). In other words, when the input analog electrical signal is low, the second NMOS transistor 80 may be off because the gate voltage is approximately zero volts. Additionally, even when the input analog electrical signal is high, the second NMOS transistor 80 may remain off because the difference between the gate voltage (e.g., voltage of the input analog electrical signal) and the source voltage (e.g., envelope voltage) is less than the threshold voltage of the second NMOS transistor 80.

As such, when the envelope voltage is above the threshold range, the switching power amplifiers 64C and 64D may operate as NMOS/PMOS inverters with the first PMOS transistor 74 and the first NMOS transistor 76 coupled in parallel. More specifically, in each switching power amplifier 64C and 64D, when the input analog electrical signal (e.g., $+V_{in}$ or $-V_{in}$) is high, the first PMOS transistor 74 may be turned off and the first NMOS transistor 76 may be turned on, thereby connecting the output to ground. On the other hand, when the input analog electrical signal is low, the first NMOS transistor 76 may be turned off and the first PMOS transistor 74 may be turn on, thereby connecting the output to the envelope voltage supply rail 70. In this manner, the first switching power amplifier 64C outputs a positive amplified analog electrical signal $+V_{out}$ and the second switching power amplifier 64D outputs a negative amplified analog electrical signal $-V_{out}$ at a desired output power.

Figure 12B:
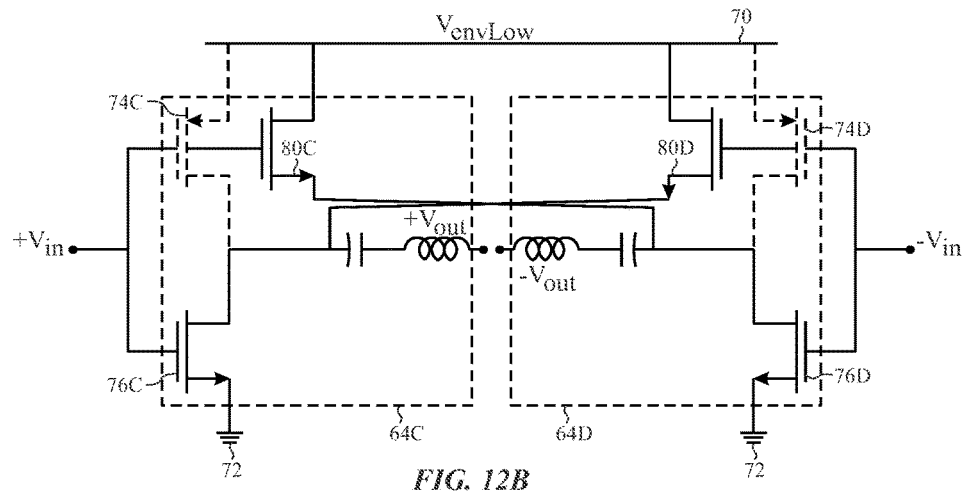
FIG. 12B is a schematic diagram of the switching power amplifiers of FIG. 11 when the envelope voltage is low, in accordance with an embodiment.

On the other hand, as depicted in FIG. 12B, when the envelope voltage is lower than the threshold range, the first PMOS transistor 74 may be maintained in an off state. As described above, the threshold range may be voltages between magnitude of the threshold voltage of the first PMOS transistor 74 and voltage of the input analog electrical signal when high minus the threshold voltage of the NMOS transistors 76 and 80. Thus, when the input analog electrical signal is high, the first PMOS transistor 74 may be off because the gate voltage is the positive voltage of the input analog electrical signal. Additionally, even when the input analog electrical signal is low, the first PMOS transistor 74 may remain off because difference between the source voltage (e.g., envelope voltage) and the gate voltage (e.g., zero volts) is less than the threshold voltage of the first PMOS transistor 74.

As such, when the envelope voltage is below the threshold range, the switching power amplifiers 64D and 64D may operate as dual NMOS inverters with the first NMOS transistor 76 coupled in parallel with the second NMOS transistor 80 of the opposite branch. More specifically, when the input analog electrical signal (e.g., $+V_{in}$ or $-V_{in}$) is high, the first NMOS transistor 76 may be turned on and the second NMOS transistor 80 of the opposite branch may off, thereby connecting the output to ground. On the other hand, when the input analog electrical signal is low, the first NMOS transistor 76 may be turned off and the second NMOS transistor 80 of the opposite branch may be turned on, thereby connecting the output to the envelope voltage supply rail 70.

Moreover, even though the switching power amplifiers 64C and 64D do not include the second PMOS transistor 78, the effects of leakage current may still be reduced. For example, in the depicted embodiment, a first leakage current may flow through the first PMOS transistor 74C and the first NMOS transistor 76C in the first switching power amplifier 64C and a second leakage current may flow through the second NMOS transistor 80D of the second switching power amplifier 64D, which may both be supplied to the positive amplified analog electrical signal $+V_{out}$. However, since parasitic capacitance across the first PMOS transistor 74C and the first NMOS transistor 76C may be different from parasitic capacitance across the second NMOS transistor 80D, magnitude of the first leakage current and the second leakage current may vary slightly and, thus, not completely cancel out. Nevertheless, as will be illustrated in more detail below, any small amount of remaining leakage current may not significantly affect operation of the switching power amplifiers 64C and 64D.

Similarly, in the depicted embodiment, a third leakage current may flow through the first PMOS transistor 74D and the first NMOS transistor 76D of the second switching power amplifier 64D and a fourth leakage current may flow through the second NMOS transistor 80C of the first switching power amplifier 64C, which may both be supplied to the negative amplified analog electrical signal $-V_{out}$. Since parasitic capacitance across the first PMOS transistor 74D and the first NMOS transistor 76D may be different from parasitic capacitance across the second NMOS transistor 80C, the magnitude of the third leakage current and the fourth leakage current may vary slightly and, thus, not completely cancel out. Nevertheless, any small amount of remaining leakage current may not significantly affect operation of the switching power amplifiers 64C and 64D.

Figure 13:
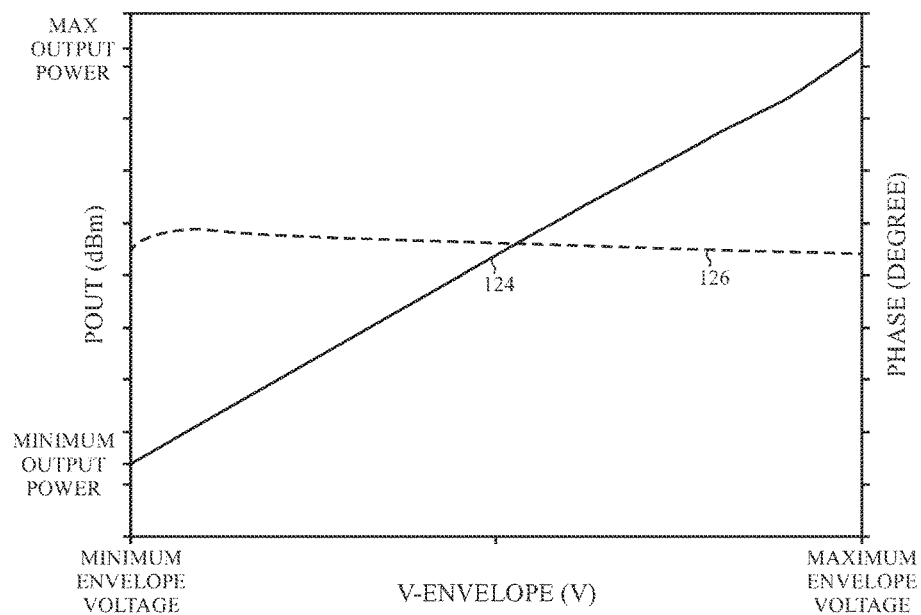
FIG. 13 is a plot of output power and phase shift in relation to envelope voltage in the switching power amplifiers of FIG. 11, in accordance with an embodiment.

To help illustrate, FIG. 13 describes output power of the amplified analog electrical signal and phase shift between the input and output analog electrical signals of the switching power amplifiers 64C and 64D in relation to the envelope voltage. More specifically, FIG. 13 depicts a plot that includes an output power curve 124, which describes output power of the amplified analog electrical signal, and a phase shift curve 126, which describes phase shift between the input and output analog electrical signals.

As described by the phase shift curve 126, the phase shift between the input and output analog electrical signal is relatively constant. In some embodiments, the phase shift may vary be a few degrees with the envelope voltage. Nevertheless, such a small amount of phase shift may be accounted for in software in the radio frequency system 12. In other words, any affects of leakage current on consistency of the phase shift between input and output analog electrical signals may not significantly affect operation of the switching power amplifiers 64.

Additionally, as described by the output power curve 124, the output power of the switching power amplifiers 64C and 64D varies relatively linearly from a minimum output power when the envelope voltage is a minimum envelope voltage to a maximum output power when the envelope voltage is a maximum envelope voltage. In fact, linearity of changes to the output power is maintained even at low envelope voltages (e.g., at the minimum envelope voltage). In other words, any leakage current present does not significantly affect linearity of control over the output power of the amplified analog electrical signal.

As described above, linearity of adjustments to the output power may be facilitated by using dual NMOS inverters when the envelope voltage is below the threshold range, NMOS/PMOS inverters when the envelope voltage is above the threshold range, and combination inverters (e.g., dual NMOS inverter and the NMOS/PMOS inverter in parallel) when the envelope voltage is within the threshold range. To help illustrate, FIG. 14 describes one example of current conducted by the first NMOS transistor 76 and the first PMOS transistor 74 in a first switching power amplifier (e.g., switching power amplifier 64C) and current conducted by the second NMOS transistor 80 in a second switching power amplifier (e.g., switching power amplifier 64D) in relation to envelope voltage.

Figure 14:
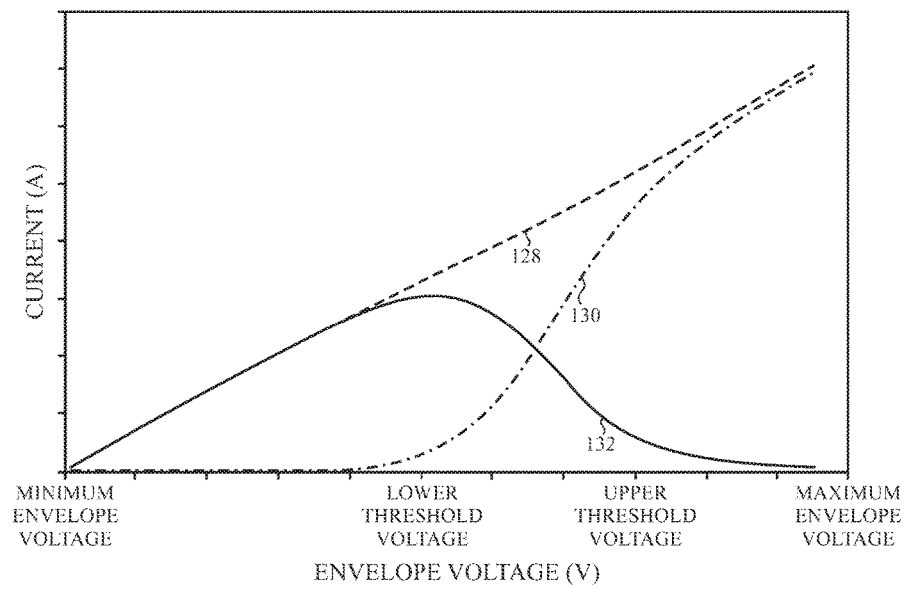
FIG. 14 is a plot of current in the transistors in relation to envelope voltage in the switching power amplifiers of FIG. 11, in accordance with an embodiment.

More specifically, FIG. 14 depicts a plot that includes a first NMOS current curve 128, which describes current conducted by the first NMOS transistor 76, a PMOS current curve 130, which describes current conducted by the first PMOS transistor 74, and a second NMOS current curve 132, which describes current conducted by the second NMOS transistor 80. Additionally, since the first NMOS transistor 76 is turned on whenever the switching power amplifier 64 is outputting an amplified analog electrical signal, the first NMOS current curve 128 may also describe current output to the metering components.

In the depicted embodiment, the threshold range may be between a lower threshold voltage and an upper threshold voltage. Thus, as depicted, when the envelope voltage is less than the lower threshold voltage the second NMOS transistor 80 is turned on to supply electrical power while the first PMOS transistor 74 is turned off, thereby generally operating as a dual NMOS inverter. Additionally, when the envelope voltage is greater than the upper threshold voltage the first PMOS transistor 74 is turned on to supply electrical power while the second NMOS transistor 80 is turned off, thereby generally operating as an NMOS/PMOS inverter.

Furthermore, when the envelope voltage is between the lower threshold voltage and the upper threshold voltage, the first PMOS transistor 74 and the second NMOS transistor 80 may both be partially turned on to each supply a portion of electrical power, thereby operating the switching power amplifier 64 as a combination inverter (e.g., a dual NMOS inverter and an NMOS/PMOS inverter in parallel). In fact, as depicted, linearity of the output power is generally maintained even when the envelope voltage is between the lower threshold voltage and the upper threshold voltage. As such, the transistors may be selected to provide a smooth gradual transition between operating the switching power amplifier 64 as a dual NMOS inverter and an NMOS/PMOS inverter during the threshold range.

Figure 15:
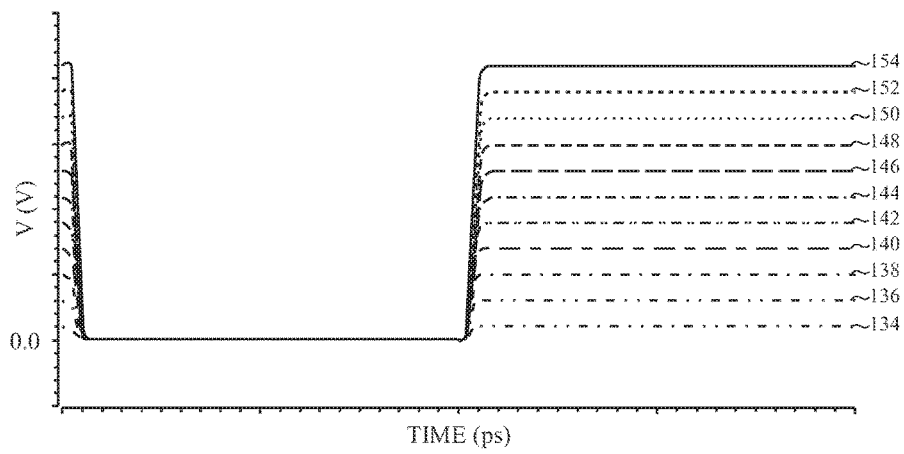
FIG. 15 is a plot of amplified analog electrical signals output by a switching power amplifier of FIG. 11 at different envelope voltages, in accordance with an embodiment.

To further illustrate improved linearity of the output power, FIG. 15 describes amplified analog electrical signals output from a switching power amplifier 64 (e.g., output powers) when a square analog electrical signal and varying envelope voltages are input. More specifically, FIG. 15 depicts a plot that includes a first output curve 134, which describes the amplified analog electrical signal when the envelope voltage is a first (e.g., minimum) envelope voltage, a second output curve 136, which describes the amplified analog electrical signal when the envelope voltage is a second envelope voltage, a third output curve 138, which describes the amplified analog electrical signal when the envelope voltage is a third envelope voltage, a fourth output curve 140, which describes the amplified analog electrical signal when the envelope voltage is a fourth envelope voltage, a fifth output curve 142, which describes the amplified analog electrical signal when the envelope voltage is a fifth envelope voltage, a sixth output curve 144, which describes the amplified analog electrical signal when the envelope voltage is a sixth envelope voltage (e.g., lower threshold voltage), a seventh output curve 146, which describes the amplified analog electrical signal when the envelope voltage is a seventh envelope voltage, an eighth output curve 148, which describes the amplified analog electrical signal when the envelope voltage an eighth envelope voltage (e.g., upper threshold voltage), a ninth output curve 150, which describes the amplified analog electrical signal when the envelope voltage is a ninth envelope voltage, a tenth output curve 152, which describes the amplified analog electrical signal when the envelope voltage is a tenth envelope voltage, and an eleventh output curve 154, which describes the amplified analog electrical signal when the envelope voltage is an eleventh (e.g., maximum) envelope voltage.

As depicted by the output curves 134-154, fidelity of the input analog electrical signal is maintained by the amplified analog electrical signal even when the envelope voltage is low (e.g., minimum envelope voltage). Moreover, fidelity of the input curve of the input analog electrical signal is also maintained by the amplified analog electrical signal when the envelope voltage is within the threshold range (e.g., between the lower threshold voltage and the upper threshold voltage). As such, the techniques described herein may reduce effects of leakage current on operation of a switching power amplifier 64, thereby improving linearity and phase shift.

Figure 16:
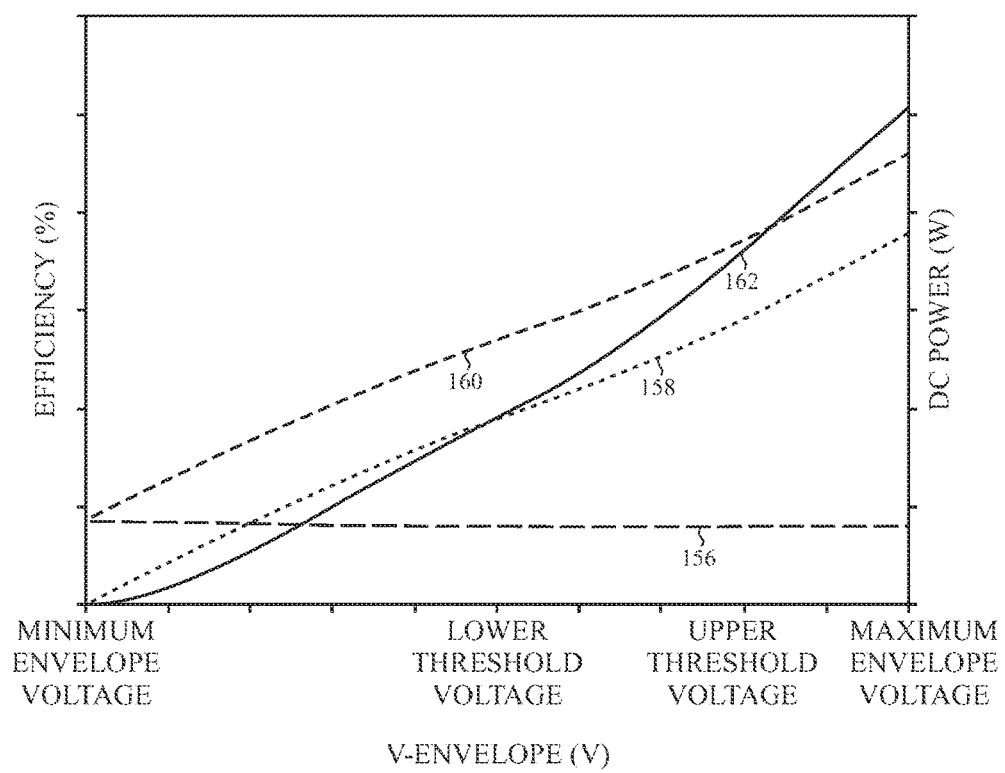
FIG. 16 is a plot of power consumption and efficiency in relation to the envelope voltage in the switching power amplifiers of FIG. 11, in accordance with an embodiment.

Moreover, as described above, the efficiency (e.g., output power/DC power consumption) of the radio frequency system may also be improved by using a combination of dual NMOS inverters and NMOS/PMOS inverters. To help illustrate, FIG. 16 describes DC power consumption by the one or more power amplifiers (e.g., inverters) 62, DC power consumption by a switching power amplifier 64, total DC power consumption of the one or more preliminary power amplifiers 62 and the switching power amplifier 64, and efficiency of the amplifier component 40 in relation to envelope voltage. More specifically, FIG. 16 depicts a plot that includes a power amplifier power consumption curve 156, which describes DC power consumption by the one or more preliminary power amplifiers 62, a switching power amplifier power consumption curve 158, which describes DC power consumption by the switching power amplifier 64, a total power consumption curve 160, which describes total DC power consumption by the one or more preliminary power amplifiers 62 and the switching power amplifier 64, and an efficiency curve 162, which describes efficiency of the amplifier component 40.

As described by the power amplifier power consumption curve 156, the DC power consumption by the one or more preliminary power amplifiers 62 remains relatively constant from the minimum envelope voltage to the maximum envelope voltage. Additionally, as described by the switching power amplifier power consumption curve 158, the DC power consumption by the switching power amplifier 64 increases relatively linearly from the minimum envelope voltage to the maximum envelope voltage. Thus, as described by the total power consumption curve 160, the total DC power consumption of the switching power amplifier 64 and the one or more preliminary power amplifiers 62 also increases relatively linearly from the minimum envelope voltage to the maximum envelope voltage.

Furthermore, as the envelope voltage increases (e.g., increasing output power), the efficiency (e.g., output power/DC power consumption) also increases. In fact, as described by the efficiency curve 162, the efficiency may increase at a slower rate when the envelope voltage is below the lower threshold voltage (e.g., below the threshold range) and increase at a faster rate when the envelope voltage is above the upper threshold voltage (e.g., above the threshold range). More specifically, the difference in the increase in efficiency may be a result of operating the switching power amplifier 64 as a dual NMOS inverter below the threshold range and operating the switching power amplifier 64 as an NMOS/PMOS inverter above the threshold range. In this manner, the efficiency of the amplifier component 40 may reach 50.7% when the envelope voltage is at the maximum envelope voltage.

In fact, the efficiency of the amplifier component 40 may be limited to 66% due to power consumption by the envelope voltage amplifier 46 and/or the metering components (e.g., capacitor 82 and inductor 84). As such, the techniques described herein may enable the one or more preliminary power amplifiers 62 and the switching power amplifier 64 to achieve an efficiency of 76.81% relative to the maximum achievable efficiency.

Accordingly, the technical effects of the present disclosure include improving operation of a switching power amplifier used in a radio frequency system. More specifically, linearity of adjustments to output power and consistency of phase shift between input and output analog electrical signals may be improved by operating the switching power amplifier as a dual NMOS inverter when desired output power is low (e.g., envelope voltage less than a threshold range), thereby reducing effects of leakage current. Additionally, efficiency of the radio frequency system may be improved by operating the switching power amplifier as an NMOS/PMOS inverter when the desired output power is high (e.g., envelope voltage above the threshold range), thereby reducing power consumption by the switching power amplifier.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A radio frequency system configured to transmit radio waves, wherein the radio frequency system comprises:
    a first switching power amplifier configured to output a first amplified analog electrical signal used to transmit the radio waves from the radio frequency system at a desired output power based at least in part on a first input electrical signal and voltage of an envelope voltage supply rail, wherein the first switching power amplifier comprises:
        a first transistor, wherein a first gate of the first transistor is configured to receive the first input electrical signal, a first source of the first transistor is configured to be electrically coupled to the envelope voltage supply rail, and a first drain of the first transistor is electrically coupled to a first output of the first switching power amplifier;
        a second transistor coupled in parallel with the first transistor, wherein a second gate of the second transistor is configured to receive the first input electrical signal, a second source of the second transistor is configured to be electrically coupled to ground, and a second drain of the second transistor is electrically coupled to the first output of the first switching power amplifier; and
        a third transistor, wherein a third gate of the third transistor is configured to receive the first input electrical signal, a third drain of the third transistor is configured to be electrically coupled to the envelope voltage supply rail, and a third source of the third transistor is electrically coupled to a second output of a second switching power amplifier.

2. The radio frequency system of claim 1, comprising:
the second switching power amplifier, wherein the second switching power amplifier is configured to output a second amplified analog electrical signal used to transmit the radio waves from the radio frequency system at the desired output power based at least in part on a second input electrical signal and the voltage of the envelope voltage supply rail, wherein the second switching power amplifier comprises:
    a fourth transistor, wherein a fourth gate of the fourth transistor is configured to receive the second input electrical signal, a fourth source of the fourth transistor is configured to be electrically coupled to the envelope voltage supply rail, and a fourth drain of the fourth transistor is electrically coupled to the second output of the second switching power amplifier;
    a fifth transistor coupled in parallel with the fourth transistor, wherein a fifth gate of the fifth transistor is configured to receive the second input electrical signal, a fifth source of the fifth transistor is configured to be electrically coupled to ground, and a fifth drain of the fifth transistor is electrically coupled to the second output of the second switching power amplifier; and
    a sixth transistor, wherein a sixth gate of the sixth transistor is configured to receive the second input electrical signal, a sixth drain of the sixth transistor is configured to be electrically coupled to the envelope voltage supply rail, and a sixth source of the sixth transistor is electrically coupled to the first output of the first switching power amplifier.

3. The radio frequency system of claim 2, wherein:
the first input electrical signal and the second input electrical signal are inverse of one another; and
the first amplified analog electrical signal and the second amplified analog electrical signal are inverse of one another.

4. The radio frequency system of claim 2, comprising:
a transformer communicatively coupled to the first output of the first switching power amplifier and the second output of the second switching power amplifier, wherein the transformer is configured to combine the first amplified analog electrical signal and the second amplified analog electrical signal into a single amplified analog electrical signal; and
an antenna configured to wirelessly transmit the radio waves based on the single amplified analog electrical signal.

5. The radio frequency system of claim 1, wherein the first switching power amplifier comprises a fourth transistor coupled in parallel with the third transistor, wherein a fourth gate of the fourth transistor is configured to receive the first input electrical signal, a fourth drain of the fourth transistor is configured to be electrically coupled to ground, and a fourth source of the fourth transistor is electrically coupled to the second output of the second switching power amplifier.

6. The radio frequency system of claim 1, wherein the first switching power amplifier comprises a capacitor and an inductor coupled to the first output of the first switching power amplifier, wherein the capacitor and the inductor are configured to smooth the first amplified analog electrical signal.

7. The radio frequency system of claim 1, wherein:
the second and the third transistors are n-type metal-oxide-semiconductor (NMOS) transistors; and
the first transistor is a p-type metal-oxide-semiconductor (PMOS) transistor.

8. The radio frequency system of claim 1, wherein the radio frequency system is configured to modulate the radio waves based at least in part on the first amplified analog electrical signal to facilitate wirelessly communicating data.

9. The radio frequency system of claim 1, wherein the first input electrical signal comprises a phase signal that indicates phase information of an analog electrical signal to be amplified by the radio frequency system.

10. The radio frequency system of claim 1, wherein the first input electrical signal indicates target phase of the first amplified analog electrical signal.

11. An electronic device configured to transmit radio waves, comprising:
a first switching power amplifier comprising:
a first output configured to output a positive amplified analog electrical signal based at least in part on a positive input electrical signal and an envelope voltage; and
a first transistor configured to supply electrical power comprising a first leakage current to the first output based at least in part on the positive input electrical signal when the envelope voltage is below a threshold range; and
a second switching power amplifier comprising a second transistor configured to supply electrical power comprising a second leakage current to the first output based at least in part on a negative input electrical signal when the envelope voltage is below the threshold range such that the first leakage current and the second leakage current substantially cancel out.

12. The electronic device of claim 11, wherein:
the second switching power amplifier comprises:
a second output configured to output a negative amplified analog electrical signal based at least in part on the negative input electrical signal and the envelope voltage, wherein the positive amplified analog electrical signal and the negative amplified analog electrical signal are inverse of one another; and
a third transistor configured to supply electrical power comprising a third leakage current to the second output based at least in part on the negative input electrical signal when the envelope voltage is below the threshold range; and
the first switching power amplifier comprises a fourth transistor configured to supply electrical power comprising a fourth leakage current to the second output based at least in part on the positive input electrical signal when the envelope voltage is below the threshold range such that the third leakage current and the fourth leakage current substantially cancel out.

13. The electronic device of claim 12, comprising:
a transformer communicatively coupled to the first output of the first switching power amplifier and the second output of the second switching power amplifier, wherein the transformer is configured to combine the positive amplified analog electrical signal and the negative amplified analog electrical signal into a single amplified analog electrical signal; and
an antenna configured to wirelessly transmit the radio waves based on the single amplified analog electrical signal.

14. The electronic device of claim 12, wherein the first transistor comprises a first n-type metal-oxide-semiconductor (NMOS) transistor coupled in parallel with a first p-type metal-oxide-semiconductor (PMOS) transistor in the first switching power amplifier.

15. The electronic device of claim 14, wherein the fourth transistor comprises a second NMOS transistor coupled in parallel with a second PMOS transistor in the first switching power amplifier.

16. The electronic device of claim 14, wherein the first NMOS transistor and the first PMOS transistor are configured to supply electrical power to the first output comprising a fifth leakage current when the envelope voltage is above the threshold range.

17. The electronic device of claim 14, wherein the threshold range comprises a range of voltages between magnitude of a first threshold voltage of the first PMOS transistor and a voltage of the positive input electrical signal when high minus a second threshold voltage of the first NMOS transistor.

18. An electronic device configured to wirelessly transmit electromagnetic waves, comprising:
an amplifier component configured to generate an amplified analog electrical signal to be wirelessly transmitted from the electronic device at a desired output power based at least in part on a first input signal, wherein the amplifier component comprises:
a first transistor configured to connect an output of a switching power amplifier to an envelope voltage supply rail when the first input signal is low and the desired output power is above a threshold range;
a second transistor configured to connect the output of the switching power amplifier to the envelope voltage supply rail when the first input signal is low and the desired output power is below the threshold range; and
a third transistor configured to connect the output of the switching power amplifier to ground when the first input signal is high.

19. The electronic device of claim 18, wherein:
the first transistor is a p-type metal-oxide semiconductor (PMOS) transistor in the switching power amplifier;
the third transistor is a first n-type metal-oxide semiconductor (NMOS) transistor in the switching power amplifier; and
the second transistor is a second NMOS transistor in another switching power amplifier configured to receive a second input signal that is inverse of the first input signal.

20. The electronic device of claim 18, wherein the desired output power corresponds with a voltage on the envelope voltage supply rail such that the desired output power is above the threshold range when the voltage is greater than voltage of the first input signal when high minus threshold voltage of the second transistor and the desired output power is below the threshold range when the voltage is less than magnitude of a threshold voltage of the first transistor.

21. The electronic device of claim 18, wherein the electronic device is configured to wirelessly communicate information by modulating the electromagnetic waves based at least in part on the amplified analog electrical signal.

22. The electronic device of claim 18, wherein, to wirelessly transmit the electromagnetic waves, the electronic device is configured to modulate radio waves based at least in part on the amplified analog electrical signal to facilitate wirelessly communicating data with another electronic device.

* * * * *